United States Patent [19]

Temple et al.

[11] Patent Number: 5,577,656
[45] Date of Patent: Nov. 26, 1996

[54] METHOD OF PACKAGING A SEMICONDUCTOR DEVICE

[75] Inventors: Victor A. K. Temple, Clifton, N.Y.; Homer H. Glascock, II, Millis, Mass.

[73] Assignee: Harris Corporation, Melbourne, Fla.

[21] Appl. No.: 462,856

[22] Filed: Jun. 5, 1995

Related U.S. Application Data

[62] Division of Ser. No. 217,801, Jan. 6, 1994, Pat. No. 5,446,316.

[51] Int. Cl.⁶ .............................. H01L 23/10; H01L 21/52
[52] U.S. Cl. ............................ 228/123.1; 228/124.6
[58] Field of Search .................... 228/123.1, 124.6, 228/180.21, 190; 257/698

[56] References Cited

U.S. PATENT DOCUMENTS 5,018,002  5/1991  Neugebauer et al. ............. 257/698
5,103,290  4/1992  Temple et al. .................... 257/698

Primary Examiner—Samuel M. Heinrich
Attorney, Agent, or Firm—Rogers & Killeen

[57] ABSTRACT

A compact package and a method of hermetically packaging a high power semiconductor device includes a metal lid bonded to a ceramic base with the semiconductor device therebetween. The lid is bonded to one surface of the device, and electrical contacts on the opposing surface of he device are bonded to foils that seal openings in the base for contact pins.

9 Claims, 1 Drawing Sheet

METHOD OF PACKAGING A SEMICONDUCTOR DEVICE

This is a division of application Ser. No. 08/217,801, filed Jan. 6, 1994, now U.S. Pat. No. 5,446,316.

BACKGROUND OF THE INVENTION

This application is related to application Ser. No. 107,309 filed Aug. 17, 1993 that is owned by the assignee of this application.

The present invention relates to packaging for semiconductor devices, and more particularly to packages and methods of packaging high power semiconductor devices in which the size and weight of the package are reduced, heat transfer from the semiconductor device is increased, and hermetic seals may be more easily made.

High power semiconductor devices such as thyristors, diodes, and the like that may conduct thousands of amperes of current and may operate at thousands of volts are finding increased application in commercial power transmission. Typically, such devices are used as fast acting switches that prevent a drop in power when there is an interruption in the line, although the uses are myriad and the present invention is non so limited.

The semiconductor devices are usually packaged to protect them from the environment in which they operate, although the packages desirably also afford reasonable access to the devices inside so that electrical connections can be made, are compact in size and lightweight, and do not hinder heat conduction away from the devices. Of these, heat conduction presents the more vexing problem as high power semiconductor devices conducting a thousand amperes or more may generate more than a kilowatt of heat in their silicon substrates, while the operating temperature is to be kept at less than 150° C. The packages are also desirably sealed to prevent exposing the devices to humidity, oxygen, dust, etc., such seals being referred to herein as hermetic. As is apparent, such seals may exacerbate the heat conduction problem.

While these desirable packaging characteristics may be relatively easy to design for some low power devices that do not generate much heat and that operate in benign environments, high power semiconductor devices that may be exposed to the elements in remote locations present a considerable packaging challenge. Prior art packages for high power semiconductor devices may adequately address one of these characteristics, but none reasonably address them all. For example, the package disclosed in U.S. Pat. No. 3,723,836 issued Mar. 27, 1973 to Shekerjian, et al. does not afford easy access to the semiconductor devices inside and does not provide sufficient thermal conductivity. The device in U.S. Pat. No. 5,248,901 issued Sep. 28, 1993 to V. A. K. Temple, one of the inventors hereof, uses a flange that adds a manufacturing step.

Accordingly, it is an object of the present invention to provide a novel package and method of packaging a semiconductor device that obviate the problems of the prior art.

It is another object of the present invention to provide a novel hermetic package and method of hermetically packaging a semiconductor device in which the package is compact and lightweight, and easy to manufacture.

It is yet another object of the present invention to provide a novel package for a semiconductor device that allows heat to be dissipated from two sides of the device while affording access for electrical connections to those two sides.

It is a further object of the present invention to provide a novel compact package for a semiconductor device that provides access to electrical contacts for the device through openings in a ceramic base and through a metal lid that is bonded to the base.

It is still a further object of the present invention to provide a novel packaged semiconductor device in which the device is protected by a metal lid and a similarly sized ceramic base that are bonded together an their edges to form a hermetic seal and in which heat from the device is conducted through both the lid and the base.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
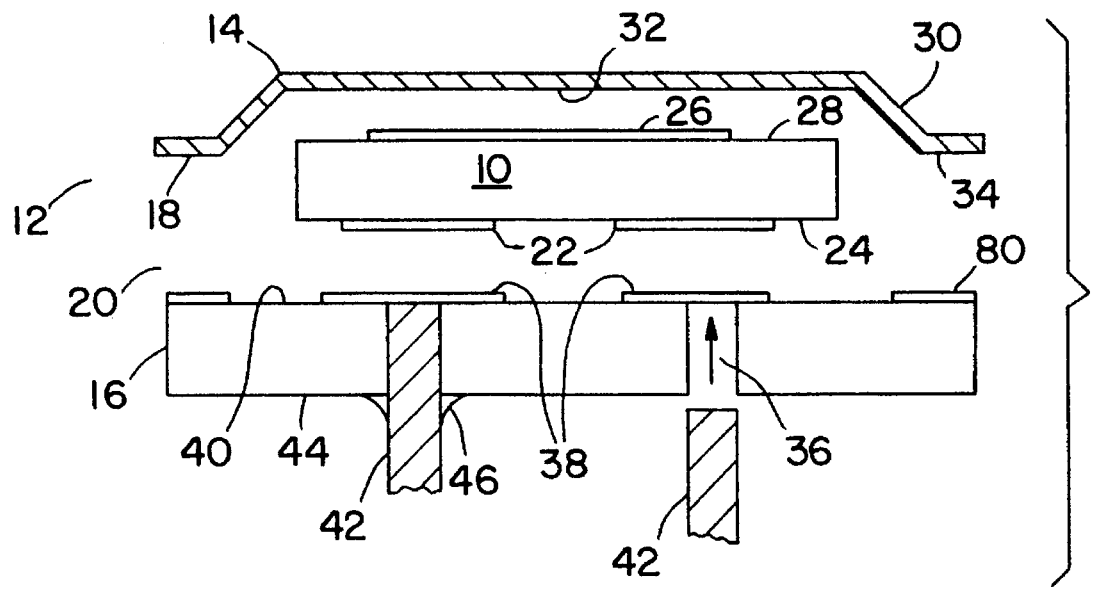
FIG. 1 is an exploded vertical cross section of an embodiment of the present invention.

With reference now to FIG. 1, an embodiment of the present invention may include a semiconductor device 10 in a package 12 with a metal lid 14 and a ceramic base 16 that are bonded together at their respective edges 18 and 20.

The semiconductor device may have a generally planar substrate, typically of silicon., with electrical contact areas 22 on a first downwardly facing surface 24. For example, the semiconductor device 10 may be a MOS controlled thyristor (MCT) having a multiplicity of metal contact areas 22 and a further metal contact area 26 on an upwardly facing surface 28. Only exemplary contact areas are depicted in the figures in the interest of clarity/, it being understood that a multiplicity of contact areas related to device elements and subelements may be provided on one or both planar surfaces of the device.

The lid 14 may be an electrically conductive metal or metals, such as copper, aluminum or a copper-molybdenum-copper laminate. In the embodiment of FIG. 1 the lid 14 has a cup-like shape; that is, with a peripheral downwardly depended portion 30. As the lid 14 is to be bonded to the upper surface 28 (or contact area 26, depending on the type of semiconductor device 10), the portion 30 should extend down so than the flat interior portion 32 of the lid 14 is in contact with the upper surface 28 (or contact area 26) when the lid 14 is bonded to the base 16. The downwardly depended portion 30 desirably has a flat edge portion 34 to facilitate bonding to the base 16.

The base 16 may be an electrically insulative and thermally conductive ceramic, such as alumina, beryllin, aluminum nitride, and the like. The edges of the base 16 and the lid 14 are desirably congruent (i.e., aligned and coextensive) when the lid and base are bonded together. A plurality of openings 36, one or more for each of the contact areas 22 on the semiconductor device 10, extend through the base 16. The openings 36 are sealed closed with flat, electrically conductive foils 38 that are bonded to the upper surface 40 of the base 16. The foils 38 are bonded to the contact areas 22 when the lid 14 and the base 16 are bonded together so that the contact areas 22 may be contacted through the openings 36 without disturbing the seal for the package. Aluminum nitride affords high thermal conductivity, high electrical insulating capacity, low dielectric loss, high mechanical strength, and a coefficient of thermal expansion close to that of silicon (desirable when the semiconductor device substrate is silicon).

Electrical contacts for the foils 38 may be provided in openings 36. For example, contact pins 42 may be provided in openings 36 and may extend externally beyond the lower surface 44 of the base 16 as far as needed When in contact with the 38, the pins 42 may be attached to the lower surface 44 with solder 46.

Figure 2:
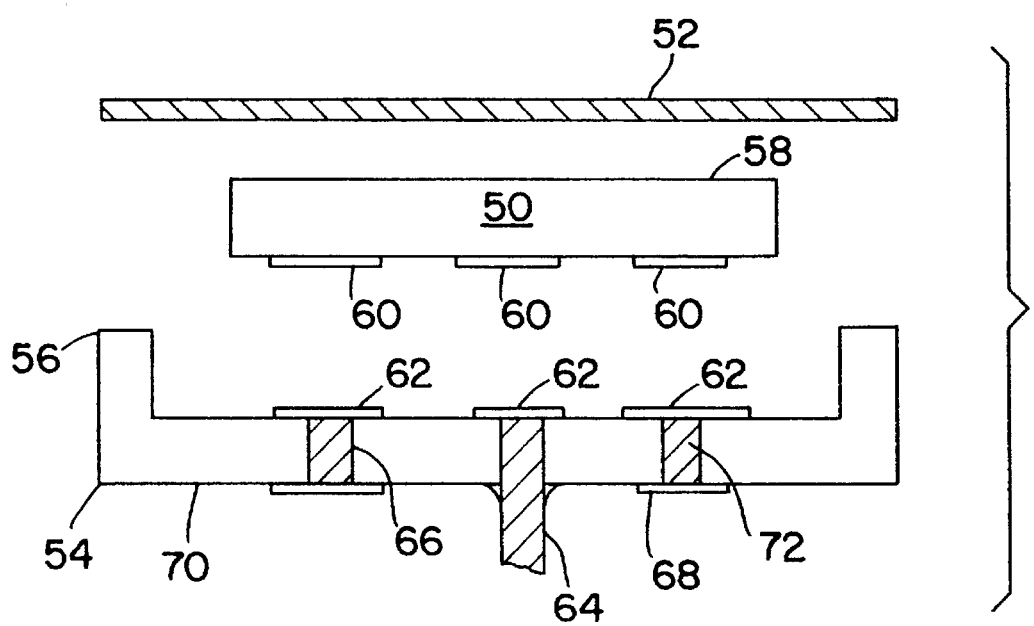
FIG. 2 is an exploded vertical cross section of another embodiment of the present invention.

With reference now to FIG. 2, an alternative embodiment of the present invention may include a semiconductor device 50 packaged between a lid 52 and a base 54. The lid 32 may be generally flat, and the base 54 may have an upwardly depended peripheral portion 56 to which the lid 52 is bonded. The peripheral portion 56 may have a height that allows the device 50 to have an upper surface 58 contacted by the lid 52 and contact areas 60 than contact foils 62 on an upper surface of the base 56 when the lid and base are bonded together.

As in the embodiment of FIG. 1, the semiconductor device 50 of FIG. 2 may have the upper surface 58 (or a contact area not shown in FIG. 2) that is bonded to the lid 52. The plural contact areas 60 may be contacted through foils 62, and pins 64 and/or other contacts may be provided in openings 66, as discussed above. By way of further example, contact pads 68 may be provided on the lower surface 70 of the base than contact the foils 52 through an electrically conductive plug 72, with the choice of pins or pads, or a combination, being related to the particular application for the packaged device. This embodiment offers greater exterior creep, cooling of the sidewalls of the semiconductor device, and strike distance, albeit at higher cost and increased likelihood of ceramic cracking.

Various bonding techniques may be used to bond the lid, base, foils and semiconductor device. For example, the direct bond copper process may be used to bond to the ceramic base, with a copper "picture frame" 80 (see FIG. 1) being added to the peripheral edge of the base far bonding the lid thereto. Alternatively, solder, diffusion bonding, gold-aluminum reaction bonding, or combinations of bonding types may be used. If solder bonding is employed, pretinning of surfaces to be soldered, such as the semiconductor device, the lid interior, and the picture frame, is recommended to avoid trapping solder flux inside the package with resultant corrosion and low voltage breakdown problems. A vent hole may be provided if necessary. If diffusion bonding or gold-aluminum reaction bonding is used, the bonded surfaces are desirably flat to avoid pressure points and bending moments than could cause cracks in the semiconductor device silicon substrate or ceramic base. Diffusion bonding can use copper-copper, copper-gold, or gold-gold surfaces. Bonding methods are discussed in the application filed concurrently herewith and U.S. Pat. No. 5,248,901 than are incorporated by reference.

As will be noted, the present invention obviates the need for wire connections to the semiconductor device and affords a particularly thin package that can be employed in a variety of hostile environments, including a coolant bath.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A method of hermetically sealing a semiconductor device in a package and improving heat transfer from the device, the device having a first, upward facing flat surface and a second, downward facing surface having plural flat connect areas thereon, the method comprising the steps of:
    (a) bonding first flat surfaces of plural foils to a flat interior portion of an electrically insulative and thermally conductive ceramic base, the base having plural openings therethrough that correspond to the plural contact areas and that each are hermetically sealed by one of the foils, the base having an edge that extends beyond an edge of the device;
    (b) bonding a flat interior portion of a lid to the first surface of the device in a thermally conductive relationship, the lid having an edge that is congruent with the edge of the base;
    (c) bonding each of the opposing flat surfaces of the first to one of the plural contact areas; and
    (d) bonding the lid and the base at their congruent edges to hermetically seal the device thereinside.

2. The method of claim 1 wherein the first surface of the device comprises a flat second contact area, the lid is electrically conductive, and wherein step (a) includes the step of bonding the second contact area to the lid, so that the device is electrically contactable through the lid.

3. The method of claim 1 further comprising the step of inserting a contact pin into each of the plural openings into an electrically conductive relationship with the foils, so that the device is electrically contactable through the pins.

4. The method of claim 1 wherein the lid has a peripheral downwardly depended portion to which the base is bonded in step (d), and wherein the base is generally planar.

5. The method of claim 1 wherein the base has a peripheral upwardly depended portion to which the lid is bonded in step (d), and wherein the lid is generally planar.

6. A method of packaging a semiconductor device comprising the steps of:
    (a) providing a semiconductor device having electrical contact areas on opposing surfaces;
    (b) attaching a metal lid to one of the contact areas on a first, upward facing surface of the device, the lid having an edge that extends beyond an edge of the device;
    (c) attaching a ceramic base having an edge congruent with the edge of the lid to the lid at their peripheral edges to hold the device thereinside, the base having plural openings therethrough corresponding to the contact areas on a second, downward facing surface of the device;
    (d) attaching first surfaces of plural electrically conductive foils to one of the downward facing contact areas of the device; and
    (e) attaching a second surface of each of the foils to the base to cover the openings.

7. The method of claim 6 further comprising the step of inserting a contact pin into each of the openings into an electrically conductive relationship with the foils so that the device is electrically contactable through the pins.

8. The method of claim 6 wherein the lid has a peripheral downwardly depended portion to which the base is attached in step (c), and wherein the base is generally planar.

9. The method of claim 6 wherein the base has a peripheral upwardly depended portion to which the lid is attached in step (c), and wherein the lid is generally planar.

* * * * *